United States Patent
Jaeger et al.

(10) Patent No.: US 9,397,271 B2
(45) Date of Patent: Jul. 19, 2016

(54) UV- AND HEAT-RESISTANT OPTOELECTRONIC SEMICONDUCTOR COMPONENT

(75) Inventors: Harald Jaeger, Regensburg (DE); Joerg Erich Sorg, Regensburg (DE); Tsutomu Kashiwagi, Annaka (JP); Toshio Shiobara, Annaka (JP)

(73) Assignees: OSRAM Opto Semiconductors GmbH (DE); Shin-Etsu Chemical Co., Ltd. (JP)

( * ) Notice: Subject to any disclaimer, the term of this patent is extended or adjusted under 35 U.S.C. 154(b) by 201 days.

(21) Appl. No.: 12/922,240

(22) PCT Filed: Apr. 20, 2009

(86) PCT No.: PCT/DE2009/000543
§ 371 (c)(1),
(2), (4) Date: Oct. 11, 2010

(87) PCT Pub. No.: WO2009/143796
PCT Pub. Date: Dec. 3, 2009

(65) Prior Publication Data
US 2011/0108870 A1    May 12, 2011

(30) Foreign Application Priority Data
May 28, 2008    (DE) .......................... 10 2008 025 491

(51) Int. Cl.
*H01L 33/00*    (2010.01)
*H01L 33/48*    (2010.01)
*H05K 1/03*    (2006.01)

(52) U.S. Cl.
CPC ............ *H01L 33/483* (2013.01); *H05K 1/0366* (2013.01); *H01L 2224/48091* (2013.01); *H01L 2924/12044* (2013.01); *H05K 2201/0162* (2013.01)

(58) Field of Classification Search
CPC ................. H01L 2924/00; H01L 2224/32225; H01L 2924/00014; H05K 2201/0162
USPC .............................................. 257/98, 99, 100
See application file for complete search history.

(56) References Cited

U.S. PATENT DOCUMENTS 3,568,012 A * 3/1971 Ernst et al. .................... 257/786
5,893,723 A * 4/1999 Yamanaka ...................... 438/65
(Continued)

FOREIGN PATENT DOCUMENTS

DE    10 2007 006 171 A1    9/2007
EP    1 187 228 A1    3/2002
(Continued)

OTHER PUBLICATIONS

Prof. Shakhashiri, Chemical of the Week—Gases of the Air, Nov. 2007.*
(Continued)

*Primary Examiner* — Jerome Jackson, Jr.
*Assistant Examiner* — David Chen
(74) *Attorney, Agent, or Firm* — DLA Piper LLP (US)

(57) ABSTRACT

An optoelectronic semiconductor component includes a connection carrier with at least two connection points and a carrier top that in a main side of the connection carrier, wherein the connection carrier configured with a silicone matrix with a fiber reinforcement, at least one optoelectronic semiconductor chip mounted on the connection carrier and in direct contact therewith, an annular potting body includes a soft silicone on the carrier top and in direct contact with the carrier top, but not in direct contact with the semiconductor chip, and a glass body comprising a glass sheet applied over the semiconductor chip and over sides of the potting body remote from the connection carrier, thereby forming a space between the semiconductor chip and the potting body.

3 Claims, 3 Drawing Sheets

(56) References Cited

U.S. PATENT DOCUMENTS

| | | | |
|---|---|---|---|
| 6,236,112 B1 * | 5/2001 | Horiuchi | H01L 21/486 257/734 |
| 6,448,583 B1 * | 9/2002 | Yoneda et al. | 257/81 |
| 7,288,798 B2 * | 10/2007 | Chang et al. | 257/99 |
| 2003/0141563 A1 * | 7/2003 | Wang | 257/432 |
| 2004/0166332 A1 | 8/2004 | Zhu et al. | |
| 2005/0035366 A1 * | 2/2005 | Imai | 257/100 |
| 2005/0173811 A1 * | 8/2005 | Kinsman | H01L 24/97 257/784 |
| 2007/0075306 A1 * | 4/2007 | Hayashi et al. | 257/13 |
| 2007/0145404 A1 * | 6/2007 | Murayama et al. | 257/99 |
| 2007/0170454 A1 | 7/2007 | Andrews | |
| 2007/0194712 A1 * | 8/2007 | Shiraishi | H01L 33/58 313/512 |
| 2007/0284714 A1 * | 12/2007 | Sakakibara et al. | 257/680 |
| 2008/0006839 A1 * | 1/2008 | Lin | 257/98 |
| 2008/0023711 A1 * | 1/2008 | Tarsa et al. | 257/98 |
| 2008/0031009 A1 | 2/2008 | Kodaira et al. | |
| 2008/0068845 A1 | 3/2008 | Aida et al. | |

FOREIGN PATENT DOCUMENTS

| | | |
|---|---|---|
| EP | 1 657 758 A2 | 5/2006 |
| GB | 1 583 544 A | 1/1981 |
| JP | 2001-257410 | 9/2001 |
| JP | 2004-221308 | 8/2004 |
| JP | 2004-292807 | 10/2004 |
| JP | 2005-183965 | 7/2005 |
| JP | 2007-258228 | 10/2007 |
| JP | 2008-71955 | 3/2008 |
| WO | 2004/081972 A2 | 9/2004 |
| WO | 2005/072031 A2 | 8/2005 |
| WO | 2005/081319 A1 | 9/2005 |
| WO | 2006/099741 A1 | 9/2006 |

OTHER PUBLICATIONS

English translation of Japanese Examination Report dated Oct. 1, 2013.

English translation of Japanese Notice of Reasons for Rejection dated Nov. 4, 2014, from corresponding Japanese Application No. 2011-510816.

* cited by examiner

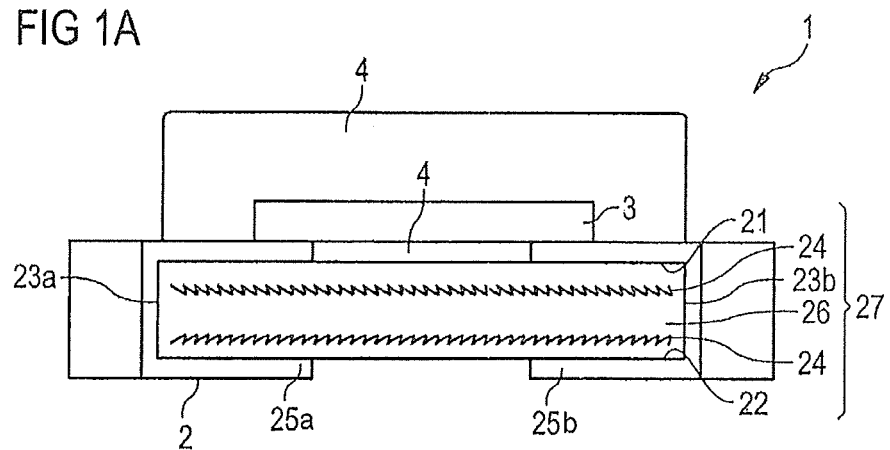
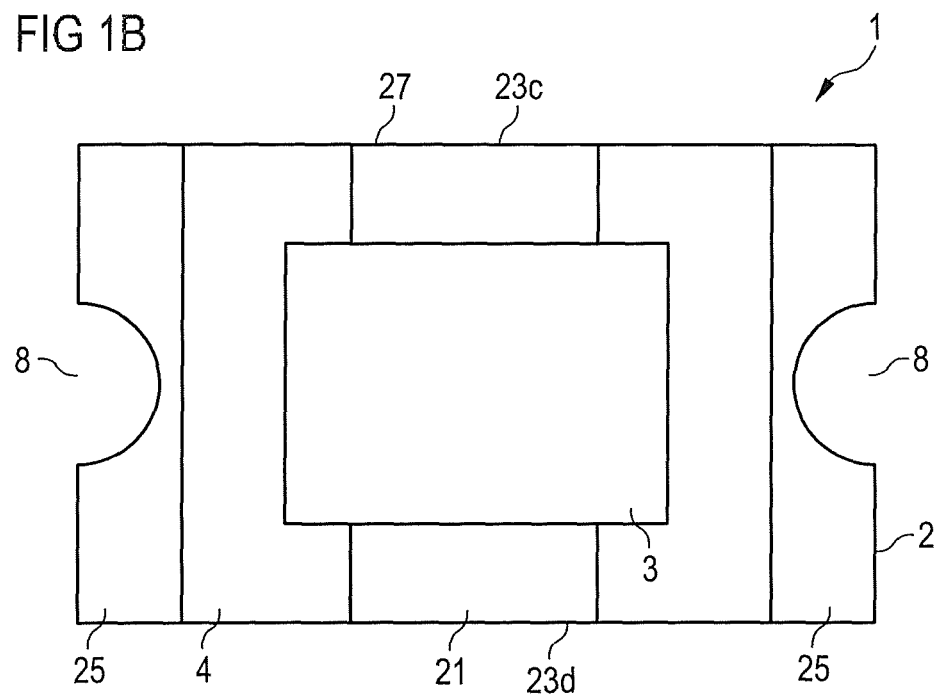

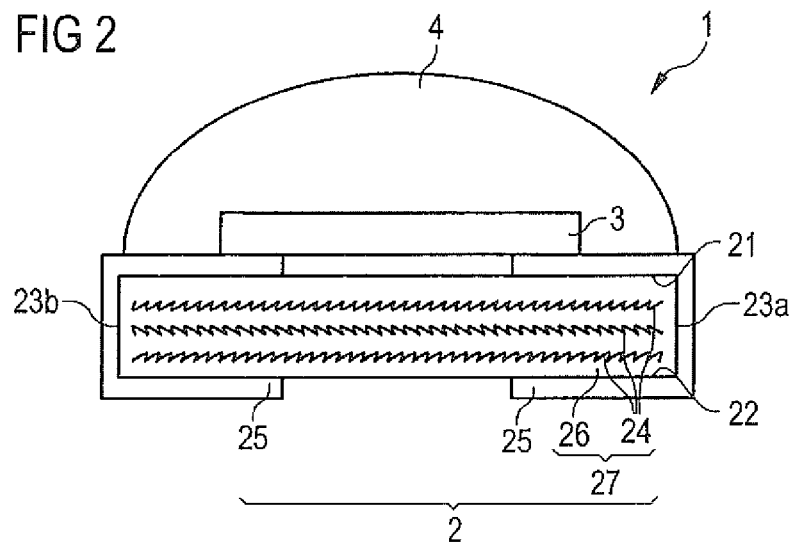
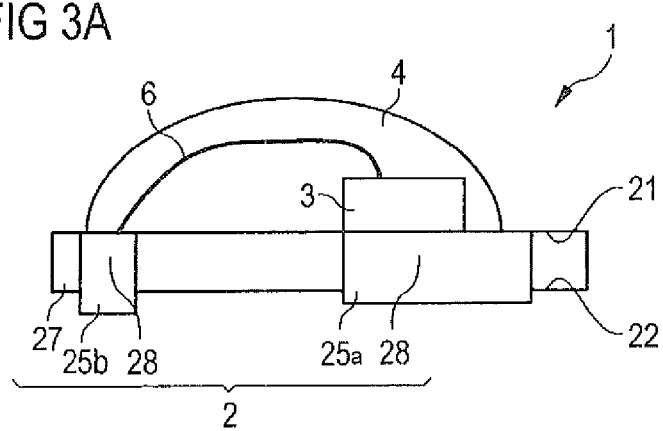
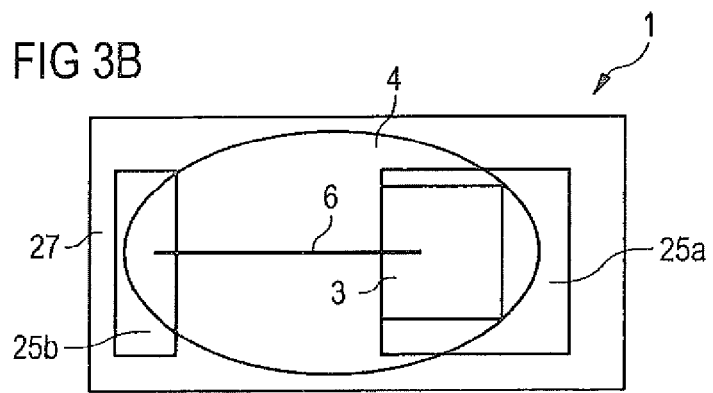

UV- AND HEAT-RESISTANT OPTOELECTRONIC SEMICONDUCTOR COMPONENT

RELATED APPLICATIONS

This is a §371 of International Application No. PCT/DE2009/000543, with an international filing date of Apr. 20, 2009 (WO 2009/143796 A3, published Dec. 3, 2009), which is based on German Patent Application No. 10 2008 025 491.6, filed May 28, 2008, the subject matter of which is incorporated by reference.

TECHNICAL FIELD

This disclosure relates to an optoelectronic semiconductor component and a printed circuit board.

BACKGROUND

Widespread industrial use is made of optoelectronic elements such as, for instance, light-emitting diodes or photodiodes. Examples of the features which encouraged the widespread use of such elements are their high efficiency and resistance to external stresses and environmental influences. For example, optoelectronic components may, for instance, resist moisture or heat well and are also resistant to mechanical stresses if suitably designed. In addition to being highly efficient, optoelectronic elements also have a long service life, are compact and may be configured in many different ways as well as being capable of production with comparatively low manufacturing costs. The critical feature with regard to many of the above-stated characteristics is often the optoelectronic component housing, in which an element is accommodated.

It could therefore be helpful to provide an optoelectronic semiconductor component which is UV- and heat-resistant. It could also be helpful to provide a UV- and heat-resistant printed circuit board.

SUMMARY

We provide an optoelectronic semiconductor component including a connection carrier with at least two connection points and configured with a silicone matrix with a fiber reinforcement, and at least one optoelectronic semiconductor chip mounted on the connection carrier and in direct contact therewith.

We also provide a printed circuit board having at least two connection points, wherein the printed circuit board is made of a silicone matrix with a fiber reinforcement of glass fibers.

BRIEF DESCRIPTION OF THE DRAWINGS

FIG. 1 is a schematic side view A and a schematic plan view B of one example of a semiconductor component described herein.

FIG. 2 is a schematic side view of a sectional representation of one example of a semiconductor component described herein.

FIG. 3 is a schematic sectional representation A and a schematic plan view B of one example of a semiconductor component described herein with incorporated thermal reservoir.

DETAILED DESCRIPTION

Figure 4:
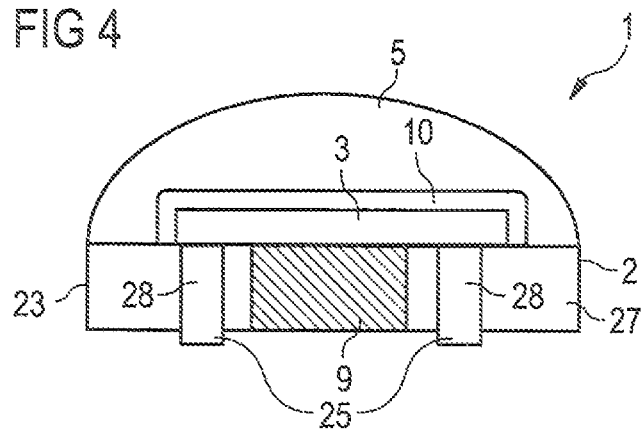
FIG. 4 is a schematic sectional representation of one example of a semiconductor component described herein with vias.

Our optoelectronic semiconductor component comprises a connection carrier. The connection carrier is preferably of tabular construction, i.e., its lateral extent is substantially greater than its thickness. The connection carrier comprises a main body. The main body preferably comprises two mutually facing main sides. At least one of the main sides is configured such that a semiconductor chip may be mounted thereon. Both sides may be of flat construction. Likewise, at least one of the main sides may comprise structuring, which may for example take the form of recesses or troughs and serve, for instance, in accommodating a semiconductor element.

The main body of the connection carrier further comprises carrier flanks formed by faces which connect the two main sides together. The main sides or carrier flanks may also comprise micro- or nanostructuring by means of which, for example, the adhesion of the structured faces for example to an external carrier or to coatings to be applied may be improved.

The connection carrier comprises at least two connection points in addition to the main body. The connection points are configured to allow electrical contacting of the connection carrier for instance with a semiconductor element and/or with an external carrier not belonging to the semiconductor component. The connection points may be formed using a metal or a metal alloy. For example, the connection points may contain copper, nickel, gold, palladium or silver or be made completely from one of these materials or from a material combination. It is likewise possible for the connection points to be formed from a transparent, electrically conductive material such as, for example, a metal oxide, these also being known as transparent conductive oxides, or TCO for short. The main body may be covered by the material of the connection points. It is possible for the connection points to be applied at least in part using a printing or screen printing method. Likewise, the connection carrier may take the form of a large-area printed circuit board. The connection carrier may be provided for mounting with a plurality of semiconductor chips, wherein the connection carrier may also be separated into individual, smaller units before or after mounting.

Preferably, the connection points are configured such that a connection to a semiconductor element or to an external carrier may be produced by way of soldering. In this case, the semiconductor component is preferably resistant to the thermal stresses arising during a soldering process. Such a connection carrier makes it possible to efficiently achieve contacting, for instance, with an external carrier not belonging to the semiconductor component.

The optoelectronic semiconductor component comprises at least one semiconductor element in the form of an optoelectronic semiconductor chip. The semiconductor chip may take the form of a light-emitting diode, a laser diode or a photodiode. The semiconductor element may likewise be made of an organic material and, for example, be an organic light-emitting diode or based on GaN, GaP or GaAs. The semiconductor chip may emit at least in part light in the spectral range of between around 200 nm and 4 μm, in particular in the near ultraviolet or blue spectral range of between around 340 nm and 480 nm.

The semiconductor chip is in direct contact with the connection carrier, i.e., the semiconductor chip is in physical contact with the main body or with the connection points of the connection carrier. "Physical contact" does not exclude there being an adhesion-promoting layer between semiconductor chip and connection carrier, which layer consists, for instance, of a solder or an adhesive. Through the direct contact between semiconductor chip and connection carrier, good thermal coupling of the semiconductor chip to the connection carrier is ensured. The waste heat arising during operation of the semiconductor chip may be effectively dissipated by the semiconductor chip.

The main body of the connection comprises a silicone matrix with a fiber reinforcement. "Silicone matrix" here means that the material which constitutes the matrix is a silicone or indeed that the material contains a silicone. The material forming the matrix may then be a silicone hybrid material. The material then contains an epoxide, in addition to silicone. Silicone is highly heat- and UV-resistant, is transparent in the visible spectral range and is, therefore, very suitable as a matrix material for the connection carrier. A fiber reinforcement is embedded into the silicone matrix. The fiber reinforcement preferably consists of a plurality of plies of fibers, the individual layers preferably extending along a main side of the connection carrier. Within one layer of the fiber reinforcement the fibers located in this layer are oriented substantially parallel. If the electrically insulating main body comprises a plurality of layers of a fiber reinforcement, the layers are preferably rotated relative to one another, wherein "rotated" relates to an axis perpendicular to a main side of the connection carrier. Preferably, the individual layers are rotated by 90° relative to one another. A suitable material for fiber reinforcement is one which exhibits good adhesion to the matrix material and a high mechanical loading capacity. Likewise, the material of the fiber reinforcement is preferably at least as heat-resistant as the silicone matrix and has a low coefficient of thermal expansion.

The optoelectronic semiconductor component comprises connection carrier with at least two connection points, at least one optoelectronic semiconductor chip which is mounted on the connection carrier and is in direct contact therewith, the connection carrier being configured with a silicone matrix with a fiber reinforcement.

By using a connection carrier with a silicone matrix with a fiber reinforcement, a mechanically stable and at the same time heat- and UV-resistant semiconductor component may be obtained. In the case in particular of high power diodes, which exhibit high optical output powers and, thus, also produce significant waste heat, the requirements regarding heat resistance are stringent. This is also true of the use of the component, for example, in environments subject to elevated temperatures, for example, in a car headlamp in the vicinity of the engine.

In particular, when using semiconductor chips which emit blue or UV light, the connection carrier needs to be UV-resistant to achieve a long service life for the semiconductor component. These requirements may be met by the optoelectronic semiconductor component.

The fiber reinforcement is formed of glass fibers. Glass fibers exhibit good UV and heat resistance. Furthermore, the use of glass fibers ensures good adhesion of the matrix material silicone to the fiber reinforcement. Glass fibers additionally constitute an inexpensive, easy-to-handle material.

The fiber reinforcement is surrounded completely by the silicone matrix. In this way, the external faces of the main body of the connection carrier are made from the same material, namely silicone. This simplifies the attachment, for instance, of coatings to the main body. Furthermore, the fibers are protected by the silicone matrix such that, for example, it is not possible for metal ions to migrate along the fibers since no metals or metal ions reach the fibers embedded in the silicone.

The fiber reinforcement comprises at least three layers. The layers are preferably rotated relative to one another. Particularly preferably, the fiber reinforcement comprises four layers which are in each case rotated by 90° relative to one another with regard to an axis perpendicular to a main side of the connection carrier. As a result of such a multi-ply configuration of the fiber reinforcement of the main body, a mechanically stable connection carrier may be achieved.

The connection points are formed by at least one metal coating. The metal coating may consist of a plurality of layers, also of different metals or metal alloys. A first metal coating layer lying closest to the connection carrier is preferably made of copper. The layer thickness of the copper amounts preferably to less than 150 μm, particularly preferably less than 50 μm. Alternatively or in addition, further metal coating layers of nickel, palladium, gold and/or silver may be applied. The thicknesses of these further layers are preferably <25 μm, particularly preferably <5 μm, very particularly preferably <2 μm. Such metal coating layers are cost-effective and may be applied with little effort and may additionally be effectively structured.

Both a carrier top and a carrier bottom, formed in each case by one main side of the comprises connection carrier, comprises at least one metal coating. The metal coatings on the carrier top or carrier bottom may take the form of a single, continuous metal coating, connected, for instance, by way of the carrier flanks. The metal coating may be produced by dip methods, vapor deposition, sputtering or by electrogalvanic or electroplating methods. Preferably, the at least one metal coating is structured in such a way as to form regions electrically insulated from one another which are suitable, for instance, for contacting a semiconductor chip or for contacting with an external carrier, in particular, by means of soldering. Preferably, the metal coating covers the majority of the surface of the main body, for example, more than 50%. Since metals generally exhibit high thermal conductivity, large-area application of at least one metal coating may form a connection carrier exhibiting high thermal conductivity.

At least one admixture is added to the silicone matrix of the main body. The admixture may take the form, for example, of a diffusion medium, a dye, a filter medium, a reflection medium, a conversion medium, for instance, in the form of a luminescent dye, a filler for adjusting the coefficients of thermal expansion or an adhesion promoter. By means of such admixtures, it is possible in particular to determine the optical behavior of the connection carrier, i.e., whether this is, for example, reflective, transmissive or absorbent. By using one or indeed a number of admixtures, the design options for the connection carrier are increased.

Electrical connection is achieved between carrier top and carrier bottom by vias. The connection carrier comprises tunnel-like holes, for example. The holes may be produced, for instance, by drilling, laser drilling or punching. It is likewise possible for the holes to be formed as early as during production of the connection carrier, for example, during casting. The faces formed by these holes or recesses in addition to carrier flanks and carrier top or carrier bottom may be provided with a metal coating which produces electrical contact between carrier top and carrier bottom or, also, be completely filled with an electrically conductive material. Vias increase the design options of the semiconductor component and make a space-saving electrical connection between the main sides of the connection carrier achievable.

Electrical connection is achieved between carrier top and carrier bottom by at least one metal coating on at least one carrier flank. Such a metal coating is easy to apply and additional structuring of the connection carrier may be dispensed with. Preferably, the metal coating extends over only two mutually facing carrier flanks.

The at least one semiconductor chip is covered by at least one potting body. The potting body is preferably in direct contact with the semiconductor chip. The potting body is preferably formed by a readily meltable or compressible material which is preferably at least partially transparent or translucent to radiation to be received or emitted by the semiconductor chip. Suitable materials are, for example, silicones, epoxides, silicone-epoxide hybrids or plastics such as polycarbonate, silicones being preferred, since they adhere well to the silicone matrix of the main body. In addition, silicones are resistant to UV ageing and are stable under high temperatures. The potting body may, for example, be produced by compression molding, liquid transfer molding, liquid injection molding or casting. Such a potting body may be efficiently applied or provides the semiconductor chip with good protection and increases the design options for the semiconductor component.

The same production methods as for the potting body are also suitable for producing the main body of the connection carrier.

The optoelectronic semiconductor component comprises a connection carrier with at least two connection points and at least one optoelectronic semiconductor chip mounted on the connection carrier and is in direct contact therewith, the connection carrier comprising a silicone matrix with a glass fiber reinforcement. Furthermore, the semiconductor component comprises a potting body of a silicone-containing material, the potting body being in direct contact at least in places with the semiconductor chip and with the main body.

In the case of such a semiconductor component, connection carrier and potting body are resistant to UV radiation and exhibit good adhesion to one another since both comprise a silicone. In addition, the coefficients of thermal expansion of connection carrier and potting body are virtually identical. The main body of the connection carrier and potting body may comprise a large contact surface with one another. The risk of detachment of the potting body from the connection carrier is significantly reduced.

The at least one semiconductor chip is covered by at least one glass body. The glass body may be in direct contact with the connection carrier or indeed be connected therewith by a frame-like intermediate carrier. Glass has high mechanical resistance to, for example, scratching and offers the semiconductor chip good protection from external influences.

The potting body and/or glass body comprises at least one admixture. If the semiconductor component comprises both a glass body and a potting body, the glass body and potting body may contain the same or indeed different admixtures. By using admixtures, the physical and chemical characteristics of potting body and/or glass body may be adjusted over a wide range.

The semiconductor chip is completely surrounded by the connection carrier and potting body and/or glass body. "Complete surrounded" means that a cavity is formed by the connection carrier and potting body and/or glass body in which the semiconductor chip is located. The cavity may be completely filled by the semiconductor chip. A connecting agent may be applied between, for instance, the connection carrier and glass body. The semiconductor chip, in particular, if this comprises organic components is preferably sealed in gas- and diffusion-tight manner. Such an arrangement provides the at least one semiconductor chip with a high level of protection from environmental influences.

The potting body and/or glass body takes the form of an optical element. The optical element may take the form of microlenses, Fresnel lenses or conventional spherical or cylindrical lenses. Likewise, structuring or reflective layers may be applied to the potting body and/or glass body. By configuring the potting body and/or glass body as an optical element, the light to be received or emitted by the semiconductor chip may be purposefully collected from one spatial region or focused into one spatial region.

The potting body and/or glass body are of multi-ply configuration. This means that the potting body comprises a plurality of layers, for example, which may be formed for instance of silicones of different hardnesses. Likewise, the individual layers may comprise different admixtures such that a first layer is designed, for example, with a filter medium, a further layer with a conversion medium and an outermost layer as an optical element. If the semiconductor component comprises both a potting body and a glass body, these may also jointly take the form of a multilayer system. It is then possible in particular to adapt the optical refractive index of the different materials to one another to achieve efficient out- or incoupling of light.

The connection carrier comprises at least one heat sink. The heat sink is preferably incorporated into the main body and preferably formed using a material with a high thermal capacity and high thermal conductivity. A suitable material may, for example, be a metal such as copper or a ceramic such as AlN. The heat sink is preferably configured such that at least one recess in the main body is filled with the material of the heat sink. Connection points and heat sink may, at least in part, be incorporated into one another. The heat sink compensates thermal peak loads and improves the dissipation of semiconductor chip waste heat away from the optoelectronic semiconductor component.

The latter is heat-resistant up to operating temperatures of at least 130° C., preferably of at least 145° C., particularly preferably of at least 165° C., very particularly preferably of at least 175° C. This means that the semiconductor component may be operated up to the corresponding temperature without a significant reduction in the intended service life of the component occurring. Such high operating temperatures may be achieved in that heat-resistant silicones are used as the matrix material of the main body, and also the further constituents of the semiconductor component exhibit corresponding heat resistance. Since silicones are relatively soft, thermal stresses between semiconductor chip and connection carrier may also be minimized. This likewise increases service life.

We further provide a printed circuit board. The printed circuit board is formed of a silicone matrix with a fiber reinforcement of glass fibers and comprises at least two connection points.

The printed circuit board may be configured, for example, as described in relation to one or more of the above-mentioned examples of an optoelectronic semiconductor component.

Some of the fields of application in which optoelectronic components or printed circuit boards described herein could be used are, for instance, the backlighting of in particular large-area displays or display means, for example, TV sets.

Furthermore, the optoelectronic components described herein may, for instance, also be used in lighting devices for projection purposes, in floodlights or spotlights or for general lighting.

A component described here will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

FIG. 1 shows an example of an optoelectronic semiconductor component 1. FIG. 1A is a sectional representation taken from FIG. 1B.

A main body 27 of a connection carrier 2 is provided with two plies of a fiber reinforcement 24. The fiber reinforcement 24 consists of glass fibers. In each ply of the fiber reinforcement 24 the fibers are in each case oriented in a direction parallel to a carrier top 21. The fibers of the two plies of the fiber reinforcement 24 are rotated by 90° relative to one another with regard to an axis perpendicular to the carrier top 21. The fiber reinforcement 24 is embedded in a silicone matrix 26, the matrix material surrounding the fiber reinforcement 24 completely on all sides.

Opposite the carrier top 21 of the connection carrier 2 is a carrier bottom 22. Carrier top 21 and carrier bottom 22 are connected together by way of faces forming carrier flanks 23a-d. The main body 27 comprises two recesses 8, which extend from the carrier top 21 to the carrier bottom 22 and interrupt the carrier flanks 23. The recesses 8 simplify mounting of the semiconductor component 1 on an external carrier not belonging to the semiconductor component 1 and not shown.

Connection points 25a, 25b are mounted on both the carrier top 21 and the carrier bottom 22 of the connection carrier 2, these taking the form of a metal coating. To ensure good adhesion of the connection points 25a, 25b forming the metal coating with the main body 27, the main body 27 is roughened or an adhesion promoter is added thereto. The metal coating is formed of a 30 µm thick copper layer, which is in direct contact with the main body 27. A silver layer with a thickness of 2 µm is applied to this copper layer. As an alternative to the silver layer, a nickel-gold layer may be applied to the copper layer, the thickness of the gold preferably amounting to less than 500 nm. Each of the connection points 25 comprises a region on the carrier top 21 which is designed for contacting a semiconductor chip 3. On the carrier bottom 22 each of the electrically mutually insulated connection points 25a, 25b comprises structuring which is suitable for connecting the semiconductor component to an external carrier, not shown, for instance by way of soldering or adhesive bonding.

The respective parts of the connection points 25a, 25b on carrier top 21 and carrier bottom 22 are connected together electrically by way of a metal coating applied to the mutually opposing carrier flanks 23a, 23b penetrated by the recesses 8, the surfaces of the main body 27 additionally formed by the recess 8 likewise being covered by the metal coating. The carrier flanks 23c, 23d are free of metal coating and are thus electrically insulating.

A semiconductor chip 3 is mounted over the carrier top 21, for example, by soldering, in such a way that the chip is in direct contact with the regions of the connection points 25 which are located on the carrier top 21. A potting body 4, for example, of a silicone is likewise formed on the carrier top 21. The cubic potting body 4 is in direct contact both with the semiconductor chip 3 and with the connection carrier 2 and, within the bounds of manufacturing tolerances, terminates flush with the carrier flanks 23c, 23d. Connection carrier 2 and potting body 4 fully enclose the semiconductor chip 3.

The outline of the connection carrier 2 is preferably rectangular, square or hexagonal. The thickness of the connection carrier 2 is preferably as small as possible, the connection carrier 2 exhibiting sufficient mechanical stability to prevent bending of the connection carrier 2, for instance. The thickness of the connection carrier 2 is ≤1 mm, preferably ≤0.6 mm, particularly preferably ≤0.4 mm.

There are no strict limits to the thickness of the semiconductor chip 3, with the thickness preferably amounting, however, to <200 µm, particularly preferably <60 µm, in particular <25 µm. The semiconductor chip 3 may, for example, take the form of a thin film chip, as described in WO 2005/081319 A1, the disclosure and contents of which regarding the semiconductor chip 3 described therein and the production method described therein is hereby incorporated by reference. The semiconductor chip 3 emits light in the near ultraviolet or in the blue spectral range, for instance.

The example according to FIG. 2 corresponds substantially to that shown in FIG. 1. The potting body 4 takes the form of a spherical lens, however. The connection carrier 2 comprises a three-ply fiber reinforcement 24, the plies being in each case rotated by 90° relative to one another, as in the example according to FIG. 1. The main body 27 of the connection carrier 2 does not comprise any recesses 8. The respective parts of the connection points 25 located on the carrier top 21 and carrier bottom 22 are connected together by way of the carrier flanks 23a, 23b.

In the example according to FIG. 3, the main body 27 of the connection carrier 2 comprises two vias 28. The vias 28 are filled with an electrically and thermally conductive material and form the connection points 25a, 25b. The connection point 25a is here larger than the connection point 25b. The two connection points 25a, 25b project beyond the main body 27 in the direction of the carrier bottom 22. This simplifies mounting of the semiconductor component 1 on an external carrier, not shown.

On the carrier top 21 the semiconductor chip 3 is mounted directly on the connection point 25a. This ensures good thermal contact between the semiconductor chip 3 and an external carrier, not shown, by way of the connection point 25a. The second electrical contact of the semiconductor chip 3 is located on a side of the chip remote from the connection carrier 2. Electrical contacting with the connection point 25 proceeds by way of a bonding wire 6. The two connection points 25a, 25b and the semiconductor chip 3 and the bonding wire 6 are covered by a lens-like potting body 4 of a silicone. The potting body 4 is in direct contact with the semiconductor chip 3 and with the connection carrier 2 and has a spherical-ellipsoidal form.

Optionally, at least one admixture 7 is added to the potting body 4, which may also take the form of a cylindrical lens, in the form of a filter medium, a reflection medium, a diffusion medium or a conversion medium. The admixture 7 may be distributed uniformly in the potting body 4 or indeed be present in local accumulations. For example, the concentration of an admixture may be greater in areas over the side of the semiconductor chip 3 remote from the connection carrier 2, for instance, to ensure uniform conversion of electromagnetic radiation emitted by the semiconductor chip 3 into radiation of a different wavelength. As an alternative to the semiconductor chip 3 shown in FIG. 3, whose electrical contact surfaces are on two mutually opposing main sides, a semiconductor chip 3 in the form of a flip chip according to FIG. 1 or 2 may also be used.

FIG. 4 shows a further example of an optoelectronic semiconductor component 1. Electrical contacting with an external carrier, not shown, proceeds by way of two vias 28, which form two connection points 25 of equal size, the vias 28 being filled with an electrically conductive material. A glass body 5 is mounted over the carrier top 21, which glass body is configured to be transparent to the radiation to be received or emitted by the semiconductor chip 3. Between semiconductor chip 3 and glass body 5 there is located a gas-filled space 10. The gas may be air, argon or nitrogen, for example. The glass body 5 takes the form of a lens-like element and terminates laterally flush with the carrier flanks 23, within the bounds of manufacturing tolerances.

The space 10 may optionally be filled with a potting body 4. When applying the glass body 5, the potting body 4 preferably displays a liquid or high-viscosity consistency, such that the space 10 is completely and form-fittingly filled by pressing the glass body 5 on in the direction of the connection carrier 2. The glass body 5 may here comprise an opening, for example, in the lateral direction such that air bubbles and/or excess compound forming the potting body 4 may escape from the space 10. Such a combination of potting body 4 and glass body 5 may result in a particularly stable connection between connection carrier 2 and glass body 5. This also results in a uniform layer thickness of the potting body 4, which may also be provided with an admixture.

As a further option, the connection carrier 2 may comprise a heat sink 9. The heat sink 9 extends from the carrier top 21 to the carrier bottom 22. The heat sink 9 may terminate flush with the carrier bottom 22, as shown in FIG. 4, or indeed project beyond the carrier bottom 22 in accordance with the connection points 25. The heat sink 9 preferably has a high thermal conductivity and also a high thermal capacity and is made for example of copper. If the heat sink 9 is electrically conductive, undesired electrical contacting may be avoided, for example, by way of an insulating layer between semiconductor chip 3 or an external carrier, not shown, and the heat sink 9.

Figure 5:
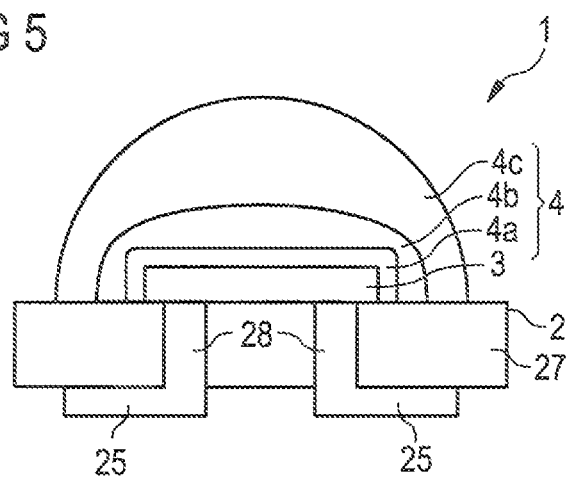
FIG. 5 is a schematic sectional representation of one example of a semiconductor component described herein with multi-ply potting body.

In the example according to FIG. 5, the connection carrier 2 comprises two vias 28 filled with a metal or a metal alloy and form the connection points 25. The parts of the connection points 25 located on the carrier bottom 22 are larger than the cross-sectional faces of the vias 28. This ensures improved thermal contact with an external carrier, not shown.

The potting body 4 comprises a plurality of layers 4a, 4b, 4c. An innermost layer 4a may, for example, be of a uniform thickness such that the layer 4a surrounds the semiconductor chip 3 on all sides with a uniform thickness, with the exception of the side facing the connection carrier 2. In this way, if a conversion medium is added to the layer 4a, uniform conversion may be achieved, for example, of the radiation emitted by the semiconductor chip 3. The layers 4b, 4c may achieve a lens efftect. Depending on how the refractive indices of the layers 4b, 4c are set relative to one another, the lens effect may be reinforced, if the refractive index of the layer 4b is lower than that of the layer 4c. It is likewise possible for the refractive index of the layer 4c to be lower than that of the layer 4b, which is in turn lower than that of the layer 4a, which is in turn lower than that of the semiconductor chip 3. In this way, the efficiency of light outcoupling from the semiconductor chip 3 may be increased.

The outermost layer 4c of the potting body 4 is optionally made of a hard silicone, thereby resulting in a semiconductor component 10 robust relative to external influences.

Figure 6:
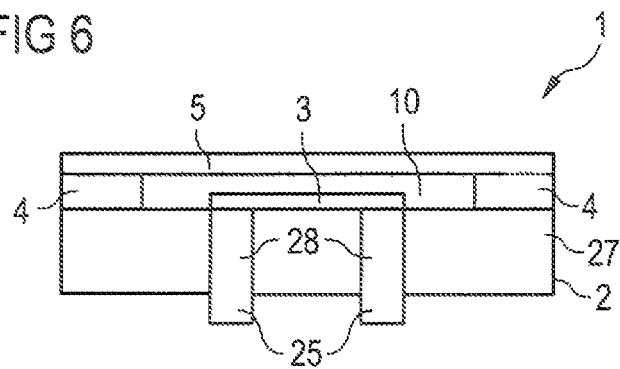
FIG. 6 is a schematic sectional representation of one example of a semiconductor component described herein with glass body and potting body.

With regard to semiconductor chip 3, connection points 25 and connection carrier 2, the example of the semiconductor component 1 according to FIG. 6 corresponds to that shown in FIG. 4. On the carrier top 21 an annular potting body 4 is mounted, which is in direct contact with the carrier top 21, but is not in direct contact with the semiconductor chip 3. The potting body 4 may be made of a soft silicone. Over the semiconductor chip 3 and over the sides of the potting body 4 remote from the connection carrier 2 there is applied a glass body 5 in the form of a glass sheet, so forming the space 10. By using a soft silicone for the potting body 4, thermal stresses which may arise between glass body 5 and connection carrier 2 during operation of the semiconductor component 1 may be compensated.

As an alternative to the potting body 4, it is also possible, for instance, to use a glass or metal frame, which may serve as a spacer between connection carrier 2 and glass body 5.

Optionally, glass body 5 and/or potting body 4, as also in the examples according to FIGS. 1 to 5, may contain different or indeed the same admixtures. Optionally, the connection points 25 or indeed the carrier top 21 facing the semiconductor chip 3 may be reflective to radiation to be emitted or received by the semiconductor chip 3. Alternatively or in addition, the connection carrier 2 as well as the potting body 4 and the glass body 5 may be transparent or translucent. If the connection points 25 occupy only a small area, an overall substantially at least partially light-permeable semiconductor component 1 may be obtained. Furthermore, a plurality of semiconductor chips emitting in different spectral ranges may be mounted on a single connection carrier 2.

The components and circuit boards described herein are not restricted by the descriptions given with reference to the examples. Rather, those devices encompass any novel feature and combination of features, including in particular any combination of features in the appended claims, even if this feature or this combination of features is not itself explicitly indicated in the claims or examples.

The invention claimed is:

1. An optoelectronic semiconductor component comprising:
   a connection carrier with at least two connection points and a carrier top that is a main side of the connection carrier, wherein the connection carrier is configured with a silicone matrix with a fiber reinforcement,
   at least one optoelectronic semiconductor chip mounted on the connection carrier on the carrier top and in direct contact therewith,
   an annular potting body comprising a soft silicone on the carrier top and in direct contact with the carrier top, but not in direct contact with the semiconductor chip, the potting body has two separate rectangular shaped areas when seen in a cross-sectional view perpendicular with the carrier top, a height of each one of the rectangular shaped areas is smaller than individual widths of the rectangular shaped areas such that a contact surface between the potting body and the connection carrier is formed to ensure adhesion between the potting body and the connection carrier, and
   a glass body comprising a plane parallel glass sheet applied over the semiconductor chip and over sides of the potting body remote from the connection carrier, thereby forming a space filled with a gas between the semiconductor chip and the potting body,
   wherein the connection points at the carrier top proceed to a carrier bottom opposite the carrier top by vias which completely run through the connection carrier, the vias are through holes filled with an electrically conductive material,
   electrical connection points at the carrier bottom project beyond the carrier bottom, coefficients of thermal expansion of the connection carrier and the potting body are substantially identical, the glass body and the potting body contain mutually different admixtures to adjust the physical and chemical characteristics of the potting body and the glass body, the glass body, the potting body and the connection carrier terminate flush with each other on lateral sides of the semiconductor component, and the connection carrier, the potting body and the glass body are translucent to radiation to be received or emitted by the semiconductor chip.

2. The component according to claim 1, wherein the fiber reinforcement is formed of glass fibers.

3. The component according to claim 1, wherein the fiber reinforcement is surrounded completely by the silicone matrix.

* * * * *